US010133264B2

(12) United States Patent
Lim

(10) Patent No.: US 10,133,264 B2
(45) Date of Patent: Nov. 20, 2018

(54) METHOD OF PERFORMING AGING FOR A PROCESS CHAMBER

(71) Applicant: Semes Co., Ltd., Cheonan-si, Chungcheongnam-do (KR)

(72) Inventor: Sung Min Lim, Cheonan-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 266 days.

(21) Appl. No.: 14/921,605

(22) Filed: Oct. 23, 2015

(65) Prior Publication Data

US 2016/0128203 A1 May 5, 2016

(30) Foreign Application Priority Data

Oct. 31, 2014 (KR) .................. 10-2014-0150189

(51) Int. Cl.
*G05B 19/418* (2006.01)
*H01L 21/67* (2006.01)

(52) U.S. Cl.
CPC .......... *G05B 19/41875* (2013.01); *G05B 2219/32177* (2013.01); *G05B 2219/32195* (2013.01); *G05B 2219/40066* (2013.01); *H01L 21/67276* (2013.01); *Y02P 90/20* (2015.11); *Y02P 90/22* (2015.11)

(58) Field of Classification Search
CPC ......... H01L 21/00; H01L 21/02; H01L 21/66; H01L 21/877; H01L 21/67276; G05B 19/41875; G05B 2219/32177; G05B 2219/32195; G05B 2219/40066; Y02P 90/20; Y02P 90/22
See application file for complete search history.

(56) References Cited

U.S. PATENT DOCUMENTS

| | | | | |
|---|---|---|---|---|
| 9,513,329 | B2* | 12/2016 | Potkonjak | G01R 31/2856 |
| 2002/0070738 | A1* | 6/2002 | Yamada | G01R 31/307 |
| | | | | 324/754.22 |
| 2005/0043910 | A1* | 2/2005 | Knebel | G06F 11/008 |
| | | | | 702/106 |
| 2014/0123085 | A1* | 5/2014 | Shroff | G06F 17/5009 |
| | | | | 716/102 |

FOREIGN PATENT DOCUMENTS

| | | |
|---|---|---|
| CN | 102270562 A | 12/2011 |
| KR | 100705421 B1 | 4/2007 |
| KR | 20070045517 A | 5/2007 |
| KR | 20140025157 A | 3/2014 |
| KR | 20140072647 A | 6/2014 |
| KR | 20150038995 A | 4/2015 |
| WO | 2007/116512 A1 * | 10/2007 |

* cited by examiner

*Primary Examiner* — Carl Arbes
(74) *Attorney, Agent, or Firm* — Harness, Dickey & Pierce, P.L.C.

(57) ABSTRACT

A method of aging a substrate-processing apparatus according to the inventive concepts may include receiving advance information of a scheduled substrate-receiving container to be loaded on a load port of the substrate-processing apparatus from a host computer, and loading a test substrate into a process chamber to perform an inspection process by means of the advance information.

6 Claims, 5 Drawing Sheets

METHOD OF PERFORMING AGING FOR A PROCESS CHAMBER

CROSS-REFERENCE TO RELATED APPLICATION

This U.S. non-provisional patent application claims priority under 35 U.S.C. § 119 to Korean Patent Application No. 10-2014-0150189, filed on Oct. 31, 2014, in the Korean Intellectual Property Office, the disclosure of which is hereby incorporated by reference in its entirety.

BACKGROUND

The inventive concepts relate to a substrate-processing apparatus and, more particularly, to a substrate-processing system and a method of aging a substrate-processing apparatus.

Apparatuses for manufacturing semiconductor devices may be interrupted for a predetermined time by periodic inspection, abrupt abnormality inspection, or replacement work of components. In addition, inspection step may be required to normally operate the apparatuses.

In detail, a test substrate instead of a normal substrate may be provided in the apparatus, and an inspection process may be performed on the test substrate under the same conditions as a normal process. Next, the processed test substrate may be inspected to determine whether the apparatus is normally operated or not.

This inspection process using the test substrate is called 'aging work'. The aging work may include basic particle inspection and may further include various inspections in accordance with a kind of a process performed on the normal substrate. In addition, a wet cleaning process may be periodically performed to a process chamber of the apparatus. In this case, the aging work may include a process of making an environment (e.g., a process environment) capable of performing the process after the wet cleaning process.

However, since a user sets and performs the inspection process when a receiving container (e.g., a front open unified pod (FOUP)) including real substrates to be processed arrives on a load port, the real substrates may be inputted into the apparatus after the inspection process is completed. In other word, the input of the real substrates may be late, so productivity of semiconductor devices may be reduced.

SUMMARY

Embodiments of the inventive concepts may provide a substrate-processing system and a method of aging a substrate-processing apparatus, which are capable of minimizing reduction of a working ratio of an apparatus caused by an inspection process.

Embodiments of the inventive concepts may also provide a substrate-processing system and a method of aging a substrate-processing apparatus, which are capable of performing an inspection process before a receiving container arrives on a load port.

In one aspect, a substrate-processing system may include: a substrate-processing apparatus performing a semiconductor unit manufacturing process; a distribution automation apparatus transferring a substrate-receiving container receiving process substrates to the substrate-processing apparatus; and a host computer outputting a transfer control signal instructing the distribution automation apparatus to transfer the substrate-receiving container in such a way that the substrate-receiving container is smoothly transferred into the substrate-processing apparatus. The host computer may provide advance information to the substrate-processing apparatus such that an auto-inspection process is performed using a test substrate in the substrate-processing apparatus before the substrate-receiving container arrives at the substrate-processing apparatus.

In an embodiment, the substrate-processing apparatus may include: a controller provided with the advance information from the host computer. The controller may control the substrate-processing apparatus through the advance information such that a process chamber of the substrate-processing apparatus is shut down and the test substrate is loaded into the shut-down process chamber to perform an inspection process for an idle time before the substrate-receiving container transferred by the distribution automation apparatus arrives.

In another aspect, a method of aging a substrate-processing apparatus may include: receiving advance information of a scheduled substrate-receiving container to be loaded on a load port of the substrate-processing apparatus, from a host computer; and loading a test substrate into a process chamber to perform an inspection process by means of the advance information.

In an embodiment, the advance information may include a process recipe of substrates loaded in the scheduled substrate-receiving container; and a time at which the scheduled substrate-receiving container arrives on the load port.

In an embodiment, loading the test substrate into the process chamber to perform the inspection process may include making an environment, in which substrates loaded in the scheduled substrate-receiving container will be processed, in the process chamber before the scheduled substrate-receiving container arrives on the load port.

In an embodiment, loading the test substrate into the process chamber to perform the inspection process may include adjusting a start time of the inspection process to set an end time of the inspection process to an estimated time of arrival of the scheduled substrate-receiving container if the end time of the inspection process is earlier than the estimated time of arrival of the scheduled substrate-receiving container.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
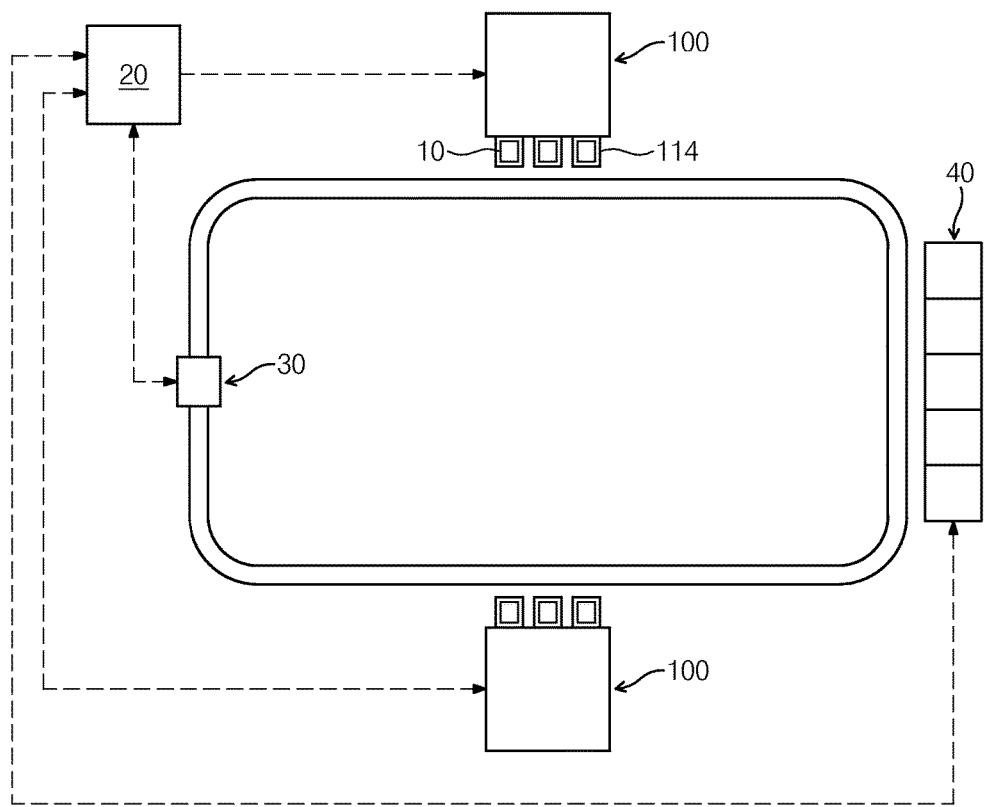
FIG. 1 is a schematic block diagram illustrating a substrate-processing system according to an embodiment of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

FIG. 1 is a schematic block diagram illustrating a substrate-processing system according to an embodiment of the inventive concepts.

Referring to FIG. 1, a substrate-processing system 1 may include a substrate-processing apparatus 100, a stocker 20 in which a substrate-receiving container 10 is loaded, a distribution automation apparatus 30 transferring the substrate-receiving container 10, and a host computer 40. The substrate-receiving container 10 may receive substrates on which a unit process is completed or will be performed. The substrate-processing apparatus 100 and the stocker 20 may be arranged along a transferring path of the distribution automation apparatus 30.

The substrate-processing apparatus 100 may perform a predetermined process on the substrate taken out from the substrate-receiving container 10. For example, the predetermined process may be a cleaning process, a deposition process, an etching process, or a photoresist-removing process.

The substrate-receiving container 10 may be a general carrier (e.g., a lot) for production and may be safely loaded on a load port 114 by the distribution automation apparatus 30. The substrate-receiving container 10 may be provided in plurality, and each of the substrate-receiving containers 10 may receive a plurality of the substrates. The plurality of substrates may be vertically stacked in the substrate-receiving container 10. To achieve this, a plurality of slots (or supporters) for receiving the plurality of substrates may be vertically arranged in the substrate-receiving container 10. For example, the substrate-receiving container 10 may be a front open unified pod (FOUP) (hereinafter, referred to as 'a carrier').

The substrate-processing apparatus 100 may include the load port 114 on which the carrier 10 transported by the distribution automation apparatus 30 is loaded. The load port 114 may be a preliminary place on which the carrier 10 receiving the substrates to be processed in the substrate-processing apparatus 100 is to be loaded. In addition, the load port 114 may be a waiting place on which the carrier 10 receiving the substrates processed in the corresponding substrate-processing apparatus 100 is to be unloaded.

In addition, the load port 114 may be projected outward from the substrate-processing apparatus 100 to load/unload the carrier 10 transported by the distribution automation apparatus 30. Moreover, the load port 114 may be injected into the substrate-processing apparatus 100 to perform a semiconductor fabricating process on the substrates loaded in the carrier 10.

Likewise, the stocker 20 may correspond to a warehouse storing the carrier 10 and may include a load port on which the carrier 10 transported by the distribution automation apparatus 30 is loaded. In addition, the stocker 20 may communicate with the host computer 40 to carry, therein, the carrier 10 including a plurality of substrates where unit processes are completed in the corresponding substrate-processing apparatus 100 and to carry out, therefrom, the carrier 10 including a plurality of substrates where unit process will be performed in the substrate-processing apparatus 100.

The distribution automation apparatus 30 may transfer the carrier 10 between the substrate-processing apparatus 100 and the distribution automation apparatus 30 and/or may transfer the carrier 10 between the stocker 20 and the substrate-processing apparatus 100.

The distribution automation apparatus 30 may transfer the carrier 10 to a specified substrate-processing apparatus 100 by a control signal outputted from the host computer 40. Even though not shown in the drawings, the distribution automation apparatus 30 may include an auto-transfer controller that receives the control signal from the host computer 40 to efficiently control a flow of the carrier 10. For example, when advance information of a corresponding carrier 10 and a track in signal are outputted from the host computer 40, the auto-transfer controller may determine its starting point and destination. In addition, the auto-transfer controller may set the shortest movement path of a corresponding carrier 10 to check whether the movement path of the corresponding carrier 10 is distinguished from a movement path of another carrier 10 and may check whether a bottleneck occurs or not to transfer the corresponding carrier 10 through a movement path capable of obtaining the maximum efficiency.

For example, the distribution automation apparatus 30 may be an automated material handling system (AMHS) including a mover (e.g., an automatic guided vehicle (AGV) or an overhead hoist transfer (OHT)). In the present embodiment, for example, the distribution automation apparatus 30 including the OHT as the mover may be located in the vicinity of two substrate-processing apparatuses 100.

The host computer 40 may communicate between the substrate-processing apparatus 100 and the distribution automation apparatus 30. The host computer 40 may control a transfer operation of the carrier 10 by the distribution automation apparatus 30 in accordance with a condition of the substrate-processing apparatus 100. Herein, the transfer operation may include a carrying-in operation of carrying the carrier into the substrate-processing apparatus 100 and a carrying-out operation of carrying the carrier out from the substrate-processing apparatus 100.

The host computer 40 may be a general computer performing a central role in an information processing system. The host computer 40 may be a computer that performs a central role of processing data processing requests of the whole organization in a centralized information processing system. For example, the host computer 40 may have a strong operating system such as time-sharing processing and/or multi-programming and may have a communication control system that may be connected on-line to a lot of terminals to process data immediately. In addition, since all data are centralized, a high-capacity auxiliary memory device may be demanded. Thus, the auxiliary memory device of the host computer 40 may store all data related to processes (e.g., a process order of each semiconductor manufacturing apparatus, a process environment, a process recipe, and movement information of a material (e.g., the carrier)) such that all semiconductor manufacturing apparatuses disposed in a semiconductor product line may perform processes under optimal conditions.

In particular, the host computer 40 may output a control signal controlling movement of a corresponding material (e.g., the carrier 10) and advance information of the carrier on the basis of a transfer due date of the corresponding material.

For example, the host computer 40 may output a transfer control signal instructing the distribution automation apparatus 30 to transfer the carrier 10 in such a way that the carrier 10 is smoothly transferred into the substrate-processing apparatus 100. In addition, the host computer 40 may provide the advance information to the substrate-processing apparatus 100 such that an auto-inspection process is performed using a test substrate in the substrate-processing apparatus 100 before a scheduled carrier 10 arrives on the load port 114 of the substrate-processing apparatus 100.

The advance information provided from the host computer 40 to the substrate-processing apparatus 100 may include a process recipe of substrates loaded in the scheduled carrier 10, a process chamber of the substrate-processing apparatus 100 in which the corresponding substrates will be processed, and a time at which the scheduled carrier 10 arrives on the load port 114.

A controller (200 of FIG. 2) of the substrate-processing apparatus 100 may receive the advance information from the host computer 40. The controller may control the substrate-processing apparatus 100 such that a specified process chamber is shut down for an idle time of the apparatus 100 and the test substrate is loaded in the shut-down process chamber to perform the inspection process. Here, the specified process chamber is a process chamber in which a process will be performed on the substrates loaded in the scheduled carrier. The idle time of the apparatus may include a waiting time before the carrier arrives on the load port 114 by the distribution automation apparatus 30.

Figure 2:
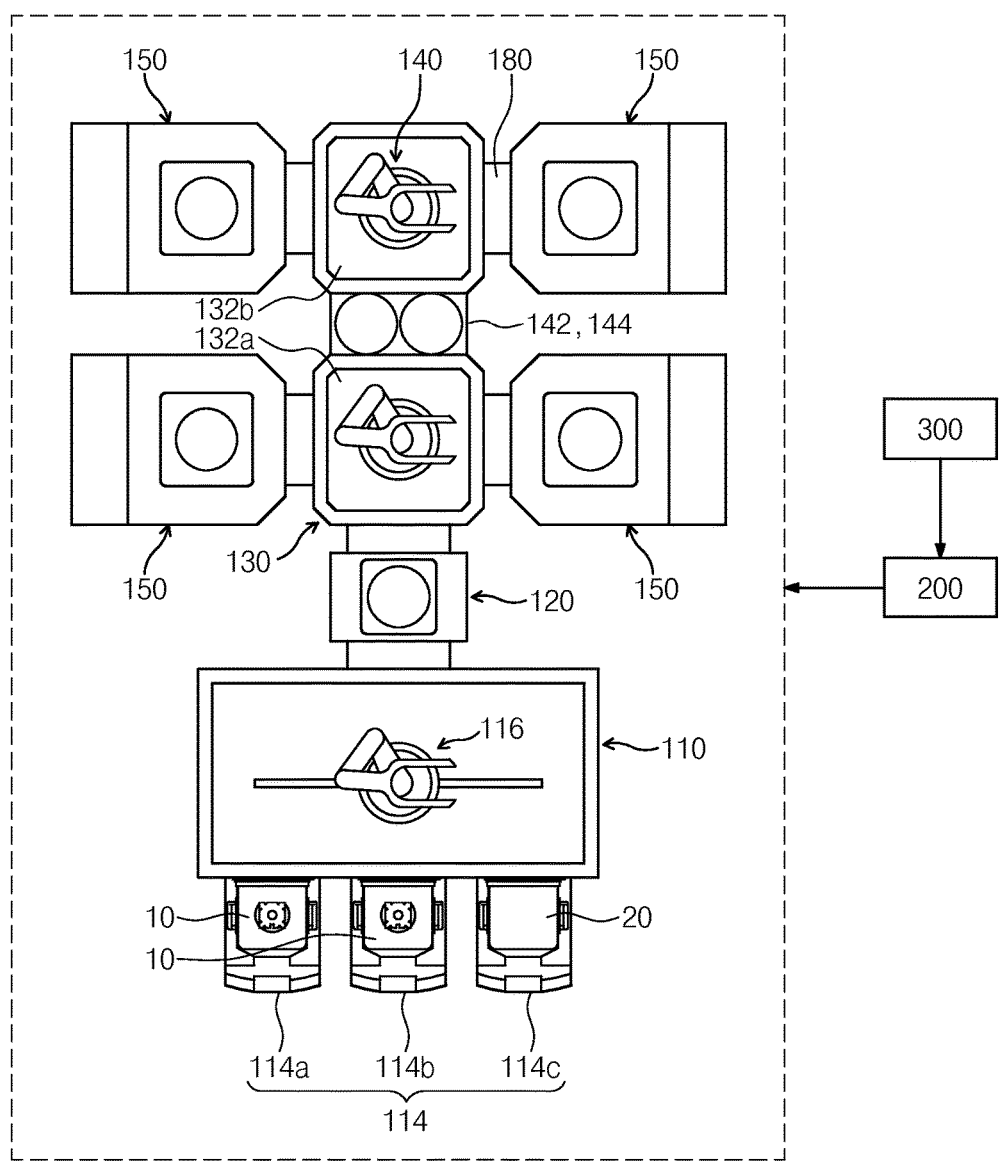
FIG. 2 is a plan view schematically illustrating a substrate-processing apparatus according to an embodiment of the inventive concepts.

FIG. 2 is a plan view schematically illustrating a substrate-processing apparatus according to an embodiment of the inventive concepts.

Referring to FIG. 2, a substrate-processing apparatus 100 may include an index unit 110, a load-lock chamber 120, a transfer unit 130, four process chambers 150 connected to the transfer unit 130, a test receiving container 20, a controller 200, and a user interface unit 300.

The index unit 110 may be disposed in front of the substrate-processing apparatus 100. The index unit 110 may be an interface unit such as an equipment front end module (EFEM) which is mainly used as a 300 mm wafer transferring apparatus. The index unit 110 may include a load port 114 on which a carrier 10 including substrates is safely loaded, and an atmospheric pressure transfer robot 116 operating at the atmospheric pressure. The load port 114 may close and open a cover of the carrier 10.

The load port 114 may be provided in plurality, and each carrier 10 may be loaded on each load port 114. For example, the plurality of load ports 114 may include a first load port 114a, a second load port 114b, and a third load port 114c. The index unit 110 may carry unprocessed substrate out from the carrier 10 or carry processed substrates into the carrier 10 in a state where the carrier 10 and the test receiving container 20 are loaded.

The test receiving container 20 may receive test substrates and may be loaded on one of the three load ports 114a to 114c. In a first embodiment, the test receiving container 20 may be loaded on the third load port 114c. The test receiving container 20 may be loaded on one, which is not often used, of the load ports 114a to 114c. The test receiving container 20 may not be unloaded from the load port but be continuously used until a limit of use of the test substrate is finished.

The test receiving container 20 may be provided at one of various positions of the substrate-processing apparatus 100, and a shape of the test receiving container 20 may be varied according to the position of the test receiving container 20. For example, if the test receiving container 20 is provided on the load port, the test receiving container 20 may have a shape of the FOUP. If the test receiving container 20 is provided at a side of the index unit 110, the test receiving container 20 may have a side storage shape.

Figure 4:
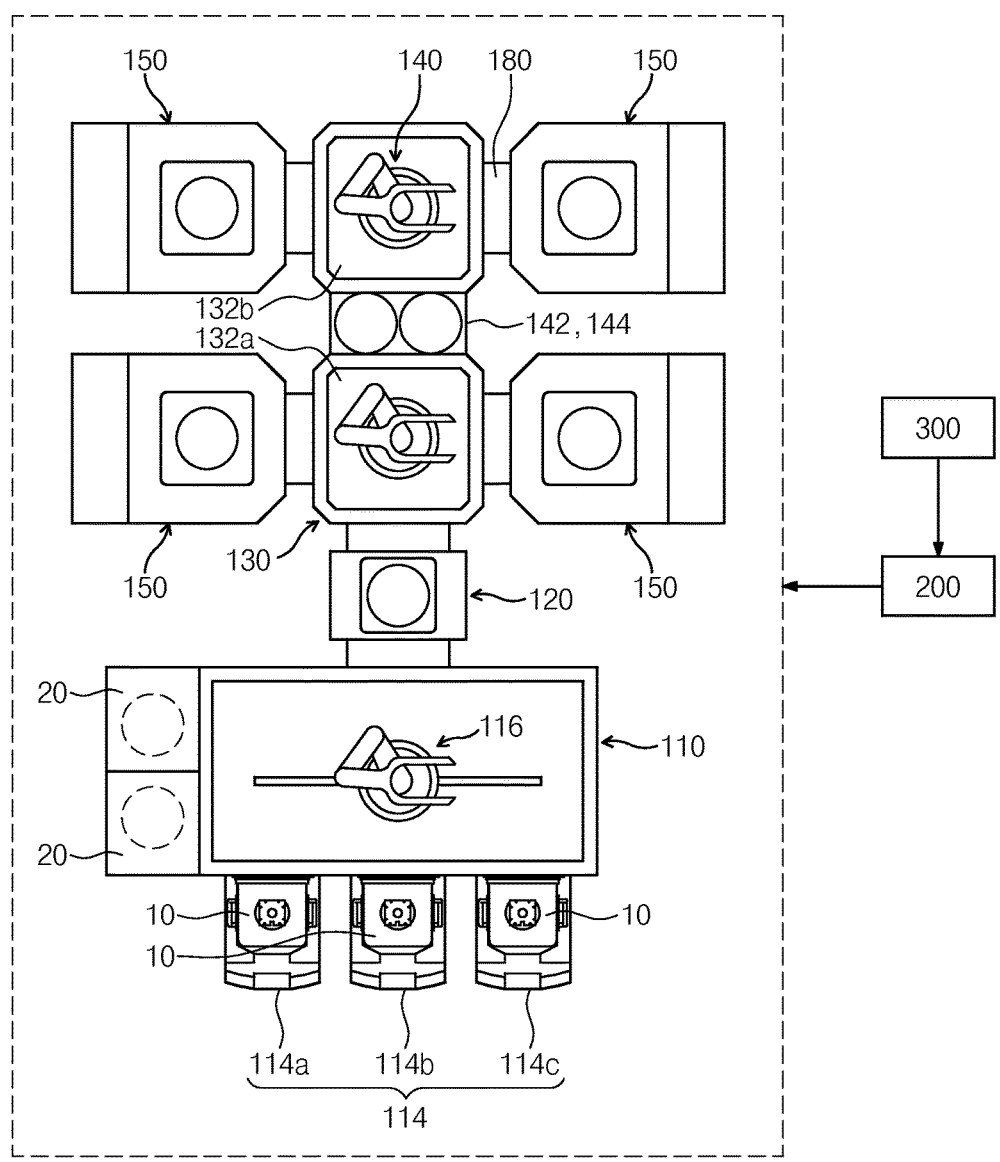
FIGS. 4 and 5 are plan views illustrating substrate-processing apparatuses according to modified embodiments of the inventive concepts.

As illustrated in FIG. 4, if the test receiving container 20 is provided in a side storage type, the test receiving container 20 may also be used as a buffer in which a process substrate processed or to be processed is loaded. In other words, the test substrate or the process substrate may be selectively loaded in the test receiving container 20 provided in the side storage type at a side of the index unit 110, as occasion arises. Alternatively, one or some slots of the test receiving container 20 may be used as a dummy slot in which the test substrate is received, and another or others of the test receiving container 20 may be used as a process slot in which the process substrate is received.

The atmospheric pressure transfer robot 116 may operate to transfer a substrate between the load port 114 and the load-lock chamber 120. The atmospheric pressure transfer robot 116 may be a robot having a single arm structure which carries one substrate out from the carrier 10 or the test receiving container 20 loaded on the load ports 114 and carries the one substrate into a cassette 112 of the load-lock chamber 120 during one operation. In other embodiments, one of various robots used in general semiconductor manufacturing processes except the robot having the single arm structure according to the present embodiment may be used as the atmospheric pressure transfer robot 116 installed in the index unit 110. For example, the atmospheric pressure transfer robot 116 may be a robot having a double blade structure capable of handling two substrates by one arm, a robot having two or more arms, or a combination robot thereof.

The substrate-processing apparatus 100 may set process priorities to the plurality of load ports.

Since the test substrate is used to perform the inspection process, the test receiving container 20 may be loaded on the load port having the lowermost priority. However, the test receiving container 20 may not be loaded on the third load port 114c, but the carrier 10 having the process substrates (e.g., general substrates) may be loaded on the third load port 114c to perform a general process without the inspection process.

The substrate of each of the receiving containers 10 loaded on the plurality of load ports 114a to 114c may experience a process (e.g., a treating process). For example, the first load port 114a may be defined as a first priority of a load port, and the second load port 114b may be defined as a second priority of a load port. In other words, the process may be performed on the substrates of a first carrier 10 loaded on the first load port 114a in a predetermined process order, and then, the completely processed substrates may be reloaded into the first carrier 10. Thereafter, the process may be performed on the substrates of a second carrier 10 loaded on the second load port 114b.

An additional process may be required to perform the inspection process using the test substrate of the test receiving container 20 loaded on the third load port 114c.

One side of the load-lock chamber 120 may be connected to the index unit 110 through one gate valve 180, and another side of the load-lock chamber 120 may be connected to a first transfer chamber 132a of the transfer unit 130 through another gate valve 180. When a transfer robot 140 of the first transfer chamber 132a loads or unloads a substrate, the inside of the load-lock chamber 120 may become the substantially same or similar vacuum state as the inside of the first transfer chamber 132a. On the contrary, when an unprocessed substrate is transferred from the index unit 110 into the load-lock chamber 120 or a processed substrate is transferred from the load-lock chamber 120 into the index unit 110, the inside of the load-lock chamber 120 may be become the atmospheric state. In other words, the inside of the load-lock chamber 120 may be converted between the vacuum state and the atmospheric state to prevent an inner pressure of the first transfer chamber 132a from being varied. The load-lock chamber 120 may include a cassette in which substrates are temporarily loaded.

The transfer unit 130 may include a plurality of transfer chambers connected in series. The transfer chambers may provide spaces in which a substrate is transferred. In the present embodiment, the plurality of transfer chambers may include the first transfer chamber 132a and a second transfer chamber 132b which are connected in series. Each of the first and second transfer chambers 132a and 132b may include the transfer robot 140 required to transfer a substrate. Two process chambers 150 may be connected to both sides of each of the first and second transfer chambers 132a and 132b through gate valves 180, respectively. A substrate may not be transferred between the transfer robots of the first and second transfer chambers 132a and 132b, and thus, first and second buffer stages 142 and 144 may be provided between the first and second transfer chambers 132a and 132b. A substrate may temporarily stay on the first and second buffer stages 142 and 144.

Each of the process chambers 150 may correspond to a chamber in which the process (e.g., a substrate-treating process) is performed on a substrate. For example, a substrate may be processed using a treatment solution in each of the process chambers 150. In this case, a cleaning process and a drying process may be generally performed before and after the process in each of the process chambers 150. The cleaning process may be performed to remove contaminations disposed on a surface of the substrate. In addition, the process chambers 150 may be configured to sequentially perform substrate-treating processes. The process chambers 150 may include first to fourth process chambers.

The controller 200 may control overall operations of the substrate-processing apparatus 100 such that the substrates loaded in the plurality of receiving containers 10 may be sequentially processed by a treating process. The controller 200 may be connected to the index unit 110, the transfer unit 130, and the process chambers 150. The controller 200 may control operations of the index unit 110, the transfer unit 130 and the process chambers 150 to perform carrying-in, carrying-out and transferring operations of a substrate. In addition, the controller 200 may control the process chambers 150 to perform the substrate-treating process.

Figure 3:
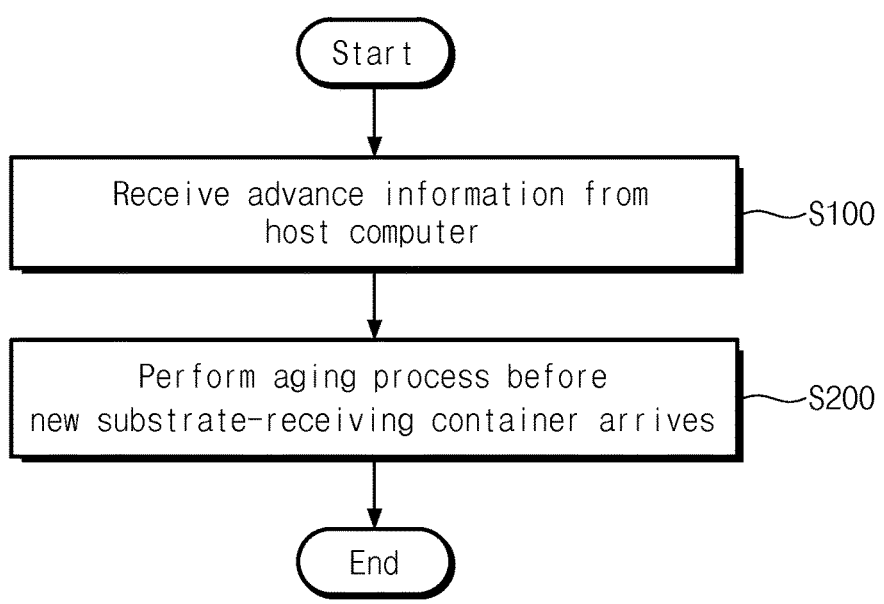
FIG. 3 is flow chart illustrating a method of aging a substrate-processing apparatus of FIG. 1.

FIG. 3 is flow chart illustrating a method of aging a substrate-processing apparatus of FIG. 1.

Referring to FIGS. 1 to 3, a method of aging the substrate-processing apparatus 100 may include providing the advance information of the scheduled carrier 10 to be loaded on the load port 114 from the host computer 40 to the substrate-processing apparatus 100 (S100), and performing the inspection process by loading the test substrate into the process chamber on the basis of the advance information (S200).

The inspection step S200 may include an aging process of making a process environment, in which substrates loaded in the scheduled carrier 10 will be processed in the process chamber, in advance before the scheduled carrier 10 arrives on the load port 114. If an end time of the inspection process is earlier than an estimated time of arrival of the scheduled carrier 10, the inspection step S200 may adjust a start time of the inspection process to set the end time of the inspection process to the estimated time of arrival of the scheduled carrier 10. For example, if the scheduled carrier 10 will arrive in 30 minutes and the inspection process will be performed for 20 minutes, the controller 200 of the substrate-processing apparatus 100 may start the inspection process in 10 minutes such that the substrate may be provided into the process chamber immediately after the scheduled carrier 10 arrives.

As described above, the substrate-processing apparatus 100 according to the inventive concepts may perform the aging process using the test substrate in advance before the scheduled carrier 10 arrives on the load port 114, and thus, a lot processing time may be saved to greatly contribute to the improvement of productivity. In other words, it is possible to reduce a loss time between the aging process performed after the arrival of the carrier and a loading start time of a substrate.

The method of aging the substrate-processing apparatus described above may be applied in a case that an aging process of a corresponding process chamber is required in a state where an apparatus idle time occurs according to the transfer of the scheduled carrier.

Hereinafter, another aging method will be described. The other aging method may be performed in a state where the carriers 10 are loaded on all load ports 114a to 114c (e.g., in a state where the apparatus idle time does not occur).

The other aging method may include performing a treating process, shutting down a process chamber, and performing an inspection process.

In the step of performing the treating process, the treating process may be performed in each of the plurality of process chambers of the substrate-processing apparatus, and a first process and a second process may be continuously performed in at least one of the process chambers.

In the step of shutting down the process chamber, when a specific condition set by a user occurs in the step of performing the treating process, the controller may interrupt operation of a corresponding process chamber for a predetermined time. Here, the specific condition may include a case that the cumulative number of substrates processed in at least one of the process chambers exceeds a predetermined number. In addition, the specific condition may include a case that abrupt abnormality occurs in the process chambers, a case that maintenance is required by replacement of a component, and a case that an idle time waiting from the first process to the second process is longer than a predetermined time.

In the step of performing the inspection process, the test substrate may be loaded into the shut-down process chamber to perform the inspection process.

In the step of performing the inspection process, the controller may set the numbers of the test substrates respectively used in the process chambers. In other words, the number of uses of each test substrate may be limited by managing cumulative usage of each test substrate, thereby inhibiting the test substrate (e.g., a dummy substrate) from being damaged.

In addition, the controller may set a usage slot region of the test substrates corresponding to each of the process chambers or each of process recipes. For example, the controller may set first to fifth slots of the test receiving container to a first process chamber, may set sixth to tenth slits thereof to a second process chamber, may set $11^{th}$ to $15^{th}$ slots thereof to a third process chamber, and may set $16^{th}$ to $20^{th}$ slots thereof to a fourth process chamber. If the shut-down process chamber is the first process chamber, the controller may withdraw the test substrates from the first to fifth slots of the test receiving container to perform the inspection process.

Meanwhile, in the step of performing the inspection process, the controller may perform the inspection process using an inspection recipe suitable to an environment of the treating process performed in a corresponding process chamber. In addition, the controller may set the number of used test substrates to manage cumulative usage of each test substrate, thereby preventing the test substrate from be broken by excessive use of the test substrate.

For example, the inspection process may be performed to only the process chamber selected by a user or may be performed to all the process chambers. The idle time of the selected process chamber may be properly checked. Here, data of a kind of the inspection process and the process chamber to be inspected may be inputted together in step of inputting a reference time.

The inspecting method of the inventive concepts may further include determining whether the inspection process is performed or not between the step of shutting down the process chamber and the step of performing the inspection process. Determining whether the inspection process is performed may be performed to each of the process chambers such that the inspection process may not be performed even though at least one of the process chambers satisfies the specific condition. Determining whether the inspection process is performed may be previously set to off-mode in the step of performing the treating process. In other words, the step of determining whether the inspection process is performed may reduce unnecessary use of the test substrate and may prevent productivity from being reduced by late supply of mass-production substrates caused by indiscreet performance of the inspection process.

The inspection process performed in the case that the idle time waiting from the first process to the second process in the step of performing the treating process is longer than the predetermined time will be described hereinafter.

When the first process is completed in at least one of the process chambers, the controller 200 may check the idle time waiting from the first process to the second process subsequent to the first process. The idle time is defined as a time interval between the first process and the second process.

Since the receiving container receives a plurality of substrates and the treating processes are performed while continuously carrying in and carrying out the substrates, the idle time may be short until the treating processes of all the substrates included in the receiving container are completed. However, when the treating processes of all the substrates included in the receiving container are completed, a time may be needed until a new receiving container is loaded on the load port, and the idle time of a specific process chamber may be lengthened according to order of total treating processes. Thus, the controller 200 may need connection with other apparatus to determine a flow of the total treating processes, and an idle time should be calculated immediately when the treating processes of the receiving container are completed in one process chamber.

If the idle time of the process chamber in which the first process is completed is greater than the predetermined reference time, the test substrate may be loaded into the process chamber in which the first process is completed. At this time, the controller 200 may control the substrate-processing apparatus 100 such that a test substrate, of which the cumulative number of use is small, of the test substrates of the test receiving container may be firstly used.

Here, the reference time may be a time for which the test substrate is loaded to complete the inspection process. The reference time may be inputted by a user and may be changed according to the kind and the environment of the inspection process.

For example, a first substrate may be first loaded into the process chamber to perform the first process, and the first substrate completely processed by the first process may be carried out from the process chamber. Thereafter, a second substrate may be loaded into the process chamber to perform the second process. If the inspection process is set in advance, after the first substrate completely processed by the first process is withdrawn, the second substrate is not loaded but the test substrate is carried out from the test receiving container. In other word, the first substrate is withdrawn and, at the same time, the carrying-out operation of the test substrate starts.

Next, the test substrates may be sequentially loaded into the process chamber designated by the inspection process, and the treating process may be performed on the test substrate. As occasion demands, the first process may be interrupted and the inspection process may be performed.

Since the inspection process is performed for the idle time for which the process chamber waits, it is possible to provide the inspection method of the substrate-processing apparatus which is capable of improving productivity by minimizing reduction of an operation rate of the apparatus.

When the first process is completed in at least one of the process chambers 150, the controller 200 of the substrate-processing apparatus 100 may check an idle time waiting until the second process subsequent to the first process starts. In an embodiment, the first process and the second process may be defined as treating processes that are respectively performed on different substrates and are sequentially performed in one process chamber 150. For example, a first substrate may be loaded into the one process chamber 150 and the first process may be performed on the first substrate. Thereafter, the first substrate processed by the first process is unloaded from the one process chamber 150. Next, a second substrate may be loaded into the one process chamber 150, and the second process may be performed on the second substrate. If the inspection process is set in advance, after the first substrate completely processed by the first process is withdrawn, the second substrate is not loaded but the test substrate is carried out from the test receiving container 20. In other word, the carrying-out operation of the test substrate starts simultaneously with the withdrawal of the first substrate.

Next, the test substrates may be sequentially loaded into the process chamber designated by the inspection process, and the treating process may be performed on the test substrates. As occasion demands, the first process may be interrupted and the inspection process may be performed.

The idle time may include a time interval between the first and second processes, for which the treating process is not performed in the process chamber 150.

Since the carrier 10 receives a plurality of substrates and the treating processes are performed while continuously carrying in and carrying out the substrates, the idle time may be short until the treating processes of all the substrates included in the carrier 10 are completed.

However, when the treating processes of all the substrates included in the carrier 10 are completed, a time may be needed until a scheduled new carrier 10 is loaded on the load port by the distribution automation apparatus 30 of FIG. 1, and the idle time of a specific process chamber 150 may be lengthened according to order of total treating processes. Thus, the controller 200 may need connection with other apparatus to determine a flow of the total treating processes, and an idle time should be calculated immediately when the treating processes of the carrier are completed in one process chamber 10.

If the idle time of the process chamber in which the first process is completed is greater than the predetermined reference time, the controller 200 may load the test substrate into the process chamber in which the first process is completed. Here, the reference time may be a time for which the test substrate is loaded to complete the inspection process. The reference time may be inputted by a user and may be changed according to the kind and the environment of the inspection process.

For example, when a user performs a specific inspection process needing 30 minutes, the reference time may be set to 30 minutes. The controller 200 may compare the idle time with the reference time. If the idle time after completion of the first process is greater than 30 minutes, the controller 200 controls the substrate-processing apparatus 100 such that the test substrate is loaded into the process chamber in which the first process is completed.

The controller 200 performs the inspection process on the test substrate loaded in the process chamber. The inspection process may be performed to only the process chamber selected by a user. Alternatively, the inspection process may be configured to be performed all of the process chambers. The idle time of the selected process chamber may be properly checked. Here, data of the kind of the inspection process and the process chamber to be inspected may be inputted together in step of inputting the reference time.

While the treating processes of the substrates are continuously performed, the controller 200 may automatically perform the inspection process if the cumulative number of substrates processed in at least one of the process chambers exceeds a predetermined number. In addition, the controller 200 may check an idle time in a case where the apparatus is periodically inspected, an idle time in a case where the apparatus is inspected by occurrence of abrupt abnormality, and an idle in a case where the apparatus is shut down by replacement of a component for a predetermined time, thereby automatically performing the inspection process.

The inspection process may include all inspection steps for normally operating the substrate-processing apparatus. In detail, the test substrate may be loaded into the process chamber, and the inspection process may be performed on the test substrate under the same conditions as a normal treating process. Subsequently, the test substrate may be inspected to determine whether the substrate-processing apparatus operates or not.

The inspection process may include the aging process. The aging process may include basic particle inspection and may further include various inspections according to the kind of the treating process. In addition, a wet cleaning process may be periodically performed to a process chamber of the apparatus. In this case, the aging process may include a process of making an environment (e.g., a process environment) capable of performing the treating process after the wet cleaning process.

The user interface unit 300 may be connected to the controller 200. A user may communicate with the controller 200 through the user interface unit 300 to control the substrate-processing apparatus 100. A user may provide various control commands to the controller 200 through the user interface unit 300, thereby controlling operations of the substrate-processing apparatus 100. In particular, a user may input setting data of the idle time with respect to the inspection process to the user interface unit 300, and the inputted data may be transmitted to the controller 200 through the user interface unit 300.

In an embodiment, a user may additionally set the inspection process (e.g., an aging recipe) through the user interface unit 300 such that the inspection process (e.g., the aging recipe) meets an environment of the treating process performed in a corresponding process chamber. In other word, when one of the process chambers performing different treating processes is shut down, the inspection process meeting the process environment of the shut-down process chamber may be performed. In addition, a user may select at least one of the process chambers through the user interface unit 300 to perform the inspection process to the selected process chamber. In other word, the inspection processes of the process chambers may be freely managed.

Furthermore, parameters of a dummy recipe may be set to adjust the environment of the process chamber to a corresponding treating process. (Additional setting data according to a default type and a process type. When a process not set in the process type is performed, the corresponding process may be performed in the default type or may stand ready.)

When the aging process is performed using the test substrate, the user interface unit 300 may provide a job history function of the corresponding test substrate. In other word, since the same job history as a general substrate-treating process is provided to the test substrate during the aging process, it is possible to easily chase an error occurring in the aging process.

Figure 5:
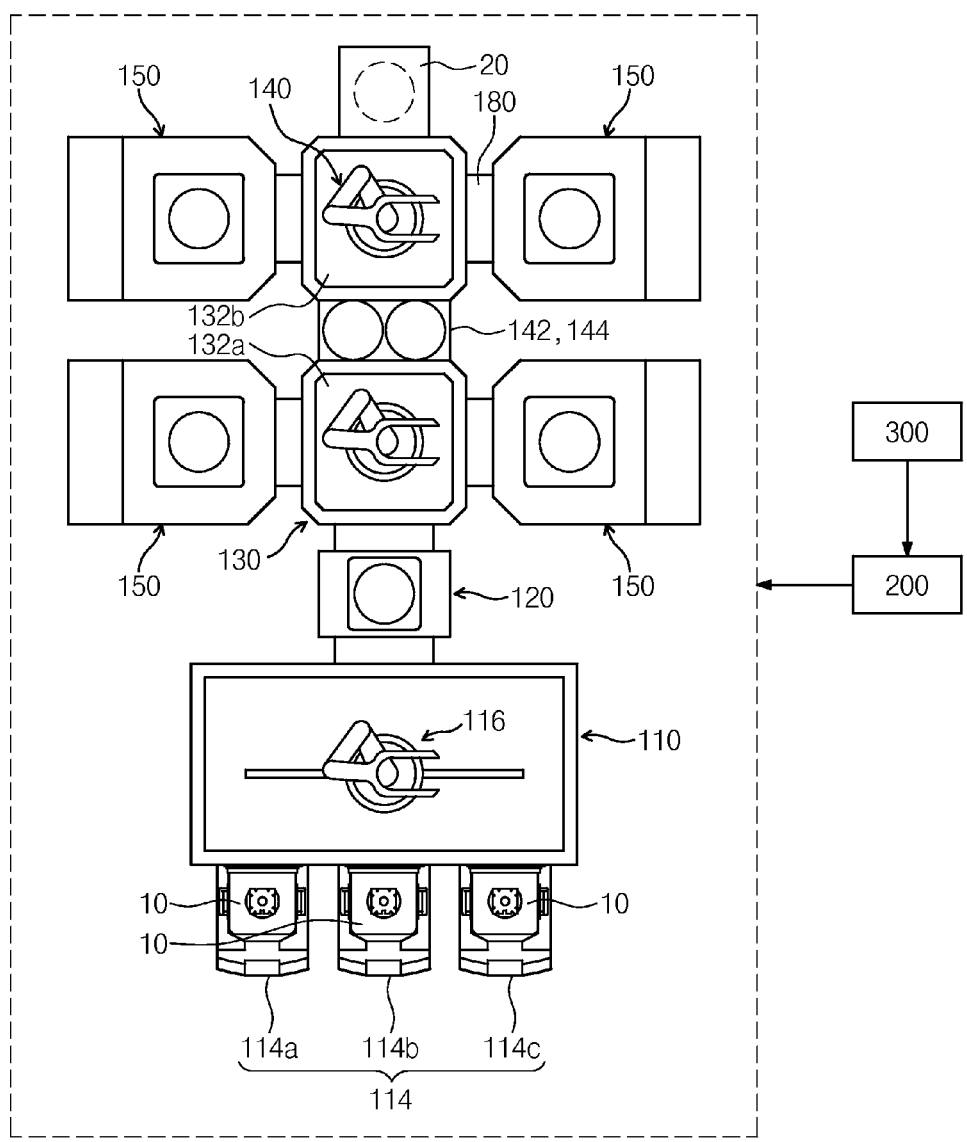

FIGS. 4 and 5 are plan views illustrating substrate-processing apparatuses according to modified embodiments of the inventive concepts.

Each of substrate-processing apparatuses 100 illustrated in FIGS. 4 and 5 may include the index unit 110, the load-lock chamber 120, the transfer unit 130, the four process chambers 150 connected to the transfer unit 130, the test receiving container 20, the controller 200, and the user interface unit 300 which are illustrated in FIG. 2. In each of the substrate-processing apparatuses 100 illustrated in FIGS.

4 and 5, the functions of the components 110, 120, 130, 150, 20, 200 and 300 may be the same as described above.

However, in the substrate-processing apparatus 100 illustrated in FIG. 4, the test receiving container 20 may be provided at a side of the index unit 110. The test receiving container 20 provided at a side of the index unit 110 may have a multi-slot structure. The maximum number of the slots, receiving test substrates, of the test receiving container 20 may be 50. In addition, the test receiving container 20 may be configured to selectively receive the test substrates or the process substrates as necessary. Alternatively, one or some of the slots of the test receiving container 20 may be used as dummy slots in which the test substrates are received, and another or others of the slots of the test receiving container 20 may be used as process slots in which the process substrates are received.

On the other hand, in the substrate-processing apparatus 100 illustrated in FIG. 5, the test receiving container 20 may be disposed at a side of the second transfer chamber 132b. The test receiving container 20 disposed at a side of the second transfer chamber 132b may have a dummy chamber shape having a plurality of slots.

As described above, the test receiving container 20 may be disposed at one of various positions except the third load port 114c. Methods of inspecting or aging the substrate-processing apparatuses 100 of FIGS. 4 and 5 may be the same as described with reference to FIGS. 1 to 3.

According to an embodiment of the inventive concepts, since the test substrate is loaded into the process chamber to perform the aging process before the scheduled carrier arrives at the substrate-processing apparatus, the productivity may be improved.

According to an embodiment of the inventive concepts, the loss time between the aging process and the loading start time of the substrate may be reduced.

According to an embodiment of the inventive concepts, since the cumulative usage of the test substrate is managed, it is possible to minimize or prevent the reduction of the operation rate of the apparatus which may be caused by breakage of the test substrate, used for a long time, in the substrate-processing apparatus.

According to an embodiment of the inventive concepts, the substrate-processing apparatus may be connected to the distribution automation apparatus, so a pre-process may be performed in a state where the test substrate is loaded into the process chamber during the idle time of the apparatus. Thus, the productivity may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of performing aging for a process chamber included in a substrate-processing apparatus, the substrate-processing apparatus including a process substrate carrier configured to receive process substrates, a load port on which the process substrate carrier transported by a distribution automation apparatus is loaded, and a test substrate container configured to receive at least one test substrates, the method comprising:
   receiving, by the substrate-processing apparatus, in advance schedule information with regard to the process substrate carrier to be loaded on the load port, from a processor configured to output a transfer control signal for the distribution automation apparatus to transfer the process substrate carrier; and
   performing the aging by loading the test substrate into the process chamber to and making a process environment in the process chamber based on the schedule information.

2. The method of claim 1, wherein the schedule information comprises:
   process-related information regarding a process scheduled to be performed in the process chamber for the process substrates provided from the process substrate carrier; and
   a time at which the process substrate carrier arrives at the load port.

3. The method of claim 1, wherein the performing comprises:
   making the environment in the process chamber in which the process substrates loaded from the process substrate carrier is processed before the process substrate carrier arrives at the load port.

4. The method of claim 3, wherein the performing comprises:
   adjusting a start time of the performing to set an end time of the performing to an estimated time of arrival of the process substrate carrier in response to the end time of the performing being earlier than the estimated time of arrival of the process substrate carrier.

5. The method of claim 1, the method further comprising:
   determining whether an aging process has been performed or not after the process chamber is shut down for an idle time of the process chamber and before the test substrate is loaded into the shut-down process chamber to perform the aging process.

6. The method of claim 1, wherein the loading the test substrate includes loading the test substrate into the process chamber in which a first process is completed in response to an idle time of the process chamber in which the first process is completed is greater than a reference value.

* * * * *